United States Patent [19]
Han et al.

[11] Patent Number: 5,850,841
[45] Date of Patent: Dec. 22, 1998

[54] CLEANING APPARATUS OF SEMICONDUCTOR DEVICE

[75] Inventors: Suk-Bin Han; Yun-Jun Huh, both of Chungcheongbuk-Do, Rep. of Korea

[73] Assignee: LG Semicon Co., Ltd., Cheongju, Rep. of Korea

[21] Appl. No.: 910,883

[22] Filed: Aug. 13, 1997

[30] Foreign Application Priority Data

Aug. 16, 1996 [KR] Rep. of Korea .................. 33875/1996

[51] Int. Cl.$^6$ ................ B05B 1/14; B08B 3/02; B08B 3/04
[52] U.S. Cl. .................. 134/86; 134/198; 134/902; 239/558
[58] Field of Search ..................... 134/902, 198, 134/186; 239/566, 567, 553, 556, 558, 559

[56] References Cited

U.S. PATENT DOCUMENTS

| | | | |
|---|---|---|---|
| 1,971,376 | 8/1934 | Hunt et al. | 239/567 |
| 2,755,851 | 7/1956 | Dow et al. | 239/566 |
| 3,567,120 | 3/1971 | Suda | 239/567 |
| 5,292,373 | 3/1994 | Arita et al. | 134/2 |
| 5,540,247 | 7/1996 | Kawatani et al. | 134/902 |

*Primary Examiner*—Jill Warden
*Assistant Examiner*—Paul J. Lee
*Attorney, Agent, or Firm*—Fleshner & Kim

[57] ABSTRACT

A nozzle for spraying a cleaning solution, a body of the nozzle having its intake at one end, its sealed end portion at the other end, and a plurality of holes arranged linearly on its surface form inside of the body to outside of the body are disclosed. Also disclosed is a cleaning apparatus of a semiconductor device which includes a bath where wafers are cleaned and a cleaning solution spraying nozzle mounted at the bottom of the bath for spraying a cleaning solution through a plurality of holes formed on its surface, with the nozzle's one side being connected to a cleaning solution supply tube and the nozzle's other side being sealed. The hole's area through which the solution passes gradually decreases from one side of the nozzle through which the cleaning solution is induced, to the other side sealed so that the solution is sprayed with a uniform pressure.

2 Claims, 5 Drawing Sheets

CLEANING APPARATUS OF SEMICONDUCTOR DEVICE

BACKGROUND OF THE INVENTION

1. Field of the Invention

The present invention relates to a cleaning apparatus of a semiconductor device, and more particularly, to a cleaning apparatus of a semiconductor device which can enhance the uniformity of wafer etching rate by uniforming the spraying pressure of a cleaning solution spraying nozzle in order to clean the wafers immersed in a bath.

2. Discussion of Related Art

Generally, the cleaning efficiency of fine patterns of a wafer and its peripheral portion, and the uniformity of wet reaction are becoming very important in semiconductor device industry, in accordance with the wafer's diameter extension for the high integration and the high integration of chip resulting from the size reduction of semiconductor device.

Therefore, lots of supplementary arts are provided for the enlargement of wet cleaning efficiency.

A conventional cleaning apparatus of semiconductor device includes an innerbath 12 for cleaning a plurality of wafers 10, a cleaning solution supply tube 15 located at the innerbath 12 for supplying a cleaning solution, a cleaning solution spraying nozzle 18 mounted at the bottom of a bath for spraying the cleaning solution through a plurality of holes formed on its surface, the nozzle's one side 1 being connected to the cleaning solution supply tube 15 and the nozzle's other side 2 being sealed. The apparatus further includes an exhaust tube 14 installed under the bath, and an outerbath 13 where the overflowing cleaning solution in the innerbath 12 is exhausted.

The following description relates to the operation of a conventional cleaning apparatus of semiconductor device.

If a pump becomes on-mode, the cleaning solution supplied to the cleaning solution supply tube 15 is filtered by a filter 16, and then flows into the innerbath 12.

As shown in FIGS. 1A and 1C, the cleaning solution supplied through the cleaning solution supply tube 15 fills the innerbath 12 from the center of the innerbath 12's bottom, or is sprayed to the lower edge or the side of the wafers 10 through the cleaning solution spraying nozzle 18 connected to one end of the cleaning solution supply tube 15.

That is to say, the cleaning solution flowing into the innerbath 12 through the cleaning solution supply tube 15 located at the center of the innerbath 12 (A direction), or through the cleaning solution spraying nozzle 18 located at the bottom of the innerbath 12 and connected to the cleaning solution supply tube 15 located at the side of the innerbath 12 (B direction), circulates between the wafers and cleans them occurring chemical reaction with the wafers' surface.

Also, the cleaning solution sprayed through multiple holes 18-1 of a size distributed at the same interval on the surface of the cleaning solution spraying nozzle 18 which is located at the bottom of the innerbath 12 in the direction of the accumulated wafers in a wafer cassette 11, cleans the edge and side of the wafers.

Additionally, if the cleaning solution which at over specific water level, flows into the innerbath 12 overflows to the outerbath 13, it is exhausted out of the apparatus through the exhaust tube 14 located at the bottom of the outerbath 13, or re-flows into the innerbath 12 through a circulating pipe where impurity is filtered, the circulating pipe being connected to the cleaning solution supply tube 15.

But, as depicted in FIG. 1D, the spraying pressure of the cleaning solution spraying nozzle 18 spraying the cleaning solution to the wafers 10 through lots of holes on the surface of the nozzle in a conventional cleaning apparatus, varies in accordance with the location of the nozzle.

That is, the deviation of the cleaning solution spraying pressure intensity increases from one side 1 of the cleaning solution spraying nozzle where the cleaning solution is supplied, to the other sealed side 2 thereof. This is because the backpressure affects the nozzle's other sealed side 2.

Therefore, there is a problem that the accumulated wafers in the wafer cassette are not cleaned uniformly.

SUMMARY OF THE INVENTION

Accordingly, the present invention is directed to a cleaning apparatus of a semiconductor device that substantially obviates one or more of the problems due to limitations and disadvantages of the related art.

An object of the present invention is to provide a cleaning apparatus of a semiconductor device which can enhance the cleaning rate by uniformly spraying cleaning solution to the lower edge or the side of wafers through a cleaning solution spraying nozzle.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a cleaning apparatus of a semiconductor device comprising a bath with a wafer cassette where a plurality of wafers are accumulated, a cleaning solution supply tube located at the lower portion of the bath, and a cleaning solution spraying nozzle whose one side 1 is connected to the cleaning solution supply tube and whose other side is sealed 2 for spraying the cleaning solution through many holes on its surface, has the cleaning solution spraying nozzle that the area of the hole decreases from one side 1 through which the cleaning solution flows to the other sealed side 2 of the nozzle, the cleaning solution spraying nozzle with angled portions that one side 1 through which the cleaning solution flows is higher than the other sealed side 2 of the nozzle, or the cleaning solution spraying nozzle that the sectional area gradually decreases from one side 1 through which the cleaning solution flows to the other sealed side 2 of the nozzle.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1A:
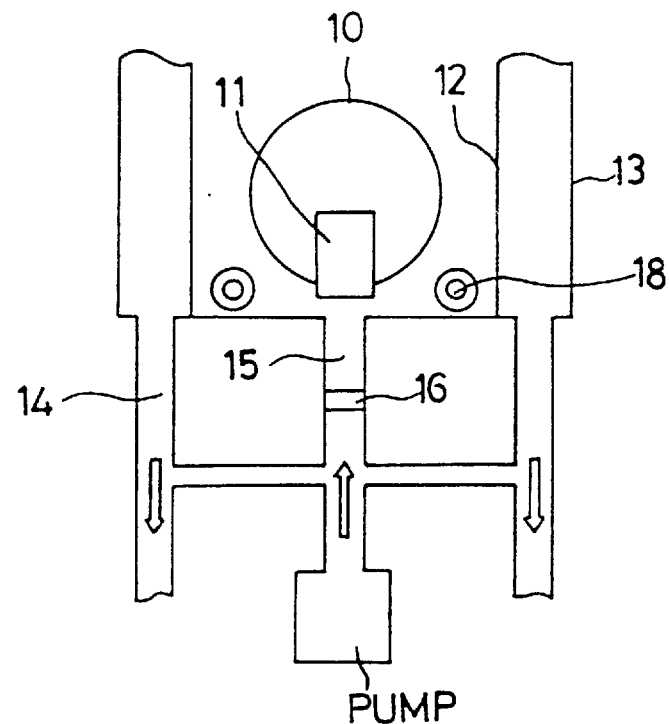
FIG. 1A is a right-sided sectional view of a conventional cleaning apparatus of semiconductor device.
Figure 1B:
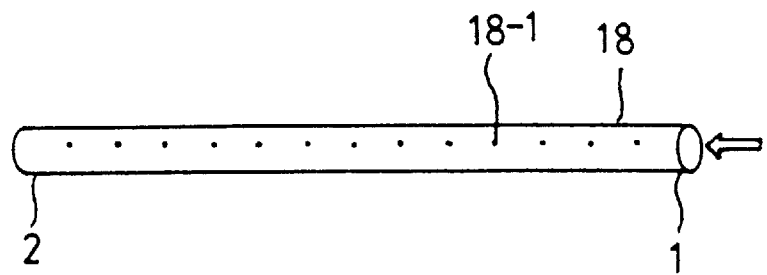
FIG. 1B illustrates a cleaning solution spraying nozzle of a conventional cleaning apparatus of semiconductor device, for spraying a cleaning solution.
Figure 1C:
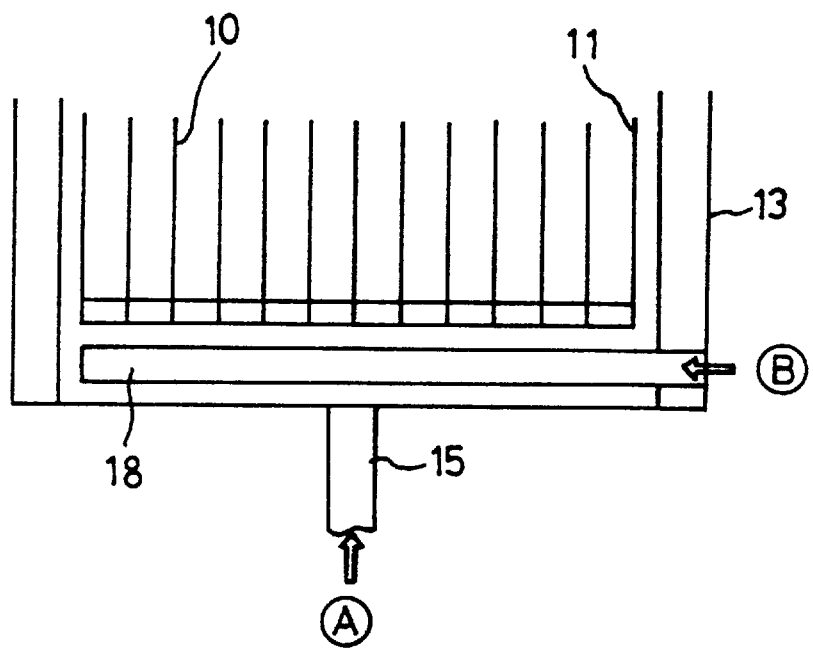
FIG. 1C is a cross-sectional view of a conventional cleaning apparatus of semiconductor device showing a course of flow of the cleaning solution.
Figure 1D:
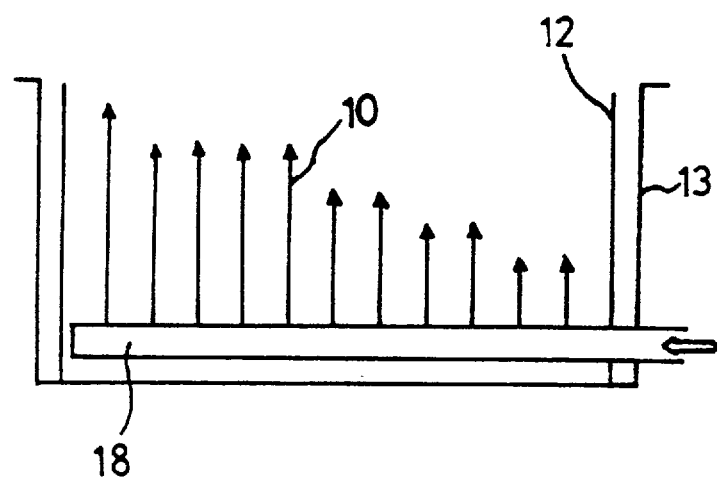
FIG. 1D shows an intensity of the cleaning solution spraying pressure from one side of a cleaning solution spraying nozzle in which the cleaning solution flows to the other sealed side thereof, through a hole on the surface of the cleaning solution spraying nozzle of a conventional cleaning apparatus of semiconductor device.
Figure 2A:
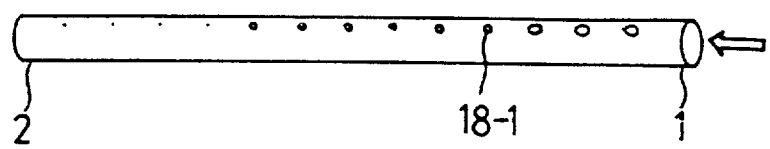
FIGS. 2A to 2F show preferred embodiments of a cleaning solution spraying nozzle of the present invention. (Arrows indicate the direction of the cleaning solution flow.)
Figure 2B:
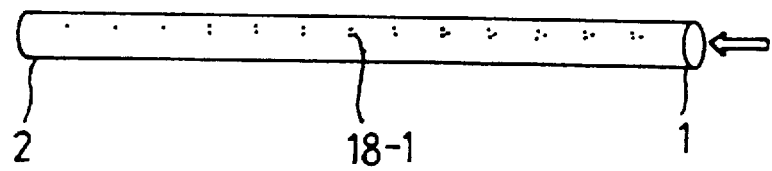

As shown in FIGS. 2A and 2B of the first preferred embodiment of the present invention, the area of the hole on the nozzle decreases from one side 1 through which the cleaning solution flows to the other sealed 2 side of the nozzle.

In order to decrease the area of the hole, the diameter of the hole gradually gets smaller from one side 1 through which the cleaning solution flows to the other sealed side 2 of the nozzle, as shown in FIG. 2A, or the number of the hole is gradually reduced from one side 1 through which the cleaning solution flows to the other sealed side 2 of the nozzle, as shown in FIG. 2B, so that the sum of the hole's area is gradually reduced in accordance with each hole's location.

The second preferred embodiment of the present invention indicates that the spraying pressure of the cleaning solution through the hole on the nozzle is uniformly put to the wafers irrespective of the nozzle's location, because the cleaning solution's pressure on the nozzle's sealed side decreases due to the nozzle's angled portions.

Figure 2C:
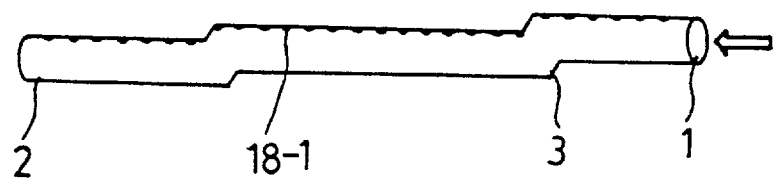

As shown in FIG. 2C, the nozzle with more than one angled portion 3 whose one side through which the cleaning solution flows is higher than the other sealed side of the nozzle, sprays the cleaning solution to the wafers with a uniform pressure.

That is, the cleaning apparatus of the present invention can eject the cleaning solution to the edge of the wafers accumulated in a wafer cassette with a uniform pressure by dividing the pressure which increases from one side 1 through which the cleaning solution flows to the other sealed side 2 of the nozzle.

The third preferred embodiment of the present invention shows that the spraying pressure of the cleaning solution through the hole on the nozzle is uniformly put to the wafers irrespective of the nozzle's location by differentiating the sectional area and the depth of the hole from one side 1 through which the cleaning solution flows to the other sealed side 2 of the nozzle.

Figure 2D:
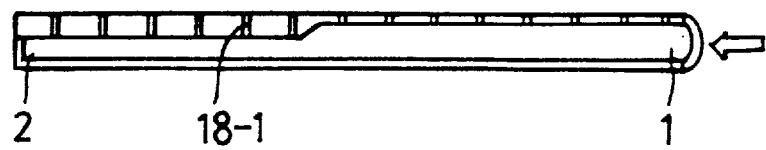
Figure 2E:
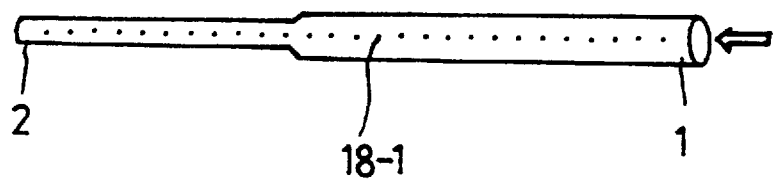
Figure 2F:
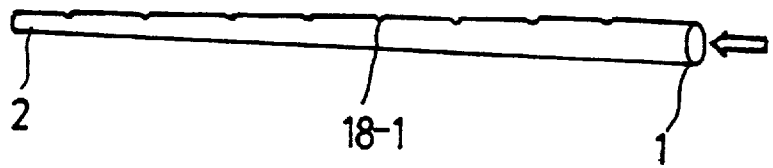

As illustrated in FIGS. 2D, 2E and 2F, the nozzle whose sectional area gradually decreases from one side through which the cleaning solution flows to the other sealed side of the nozzle, sprays the cleaning solution to the wafers with a uniform pressure.

FIG. 2D shows the nozzle in which the depth of the hole as well as its sectional area gradually decreases from one side through which the cleaning solution flows to the other sealed side of the nozzle.

Figure 2G:
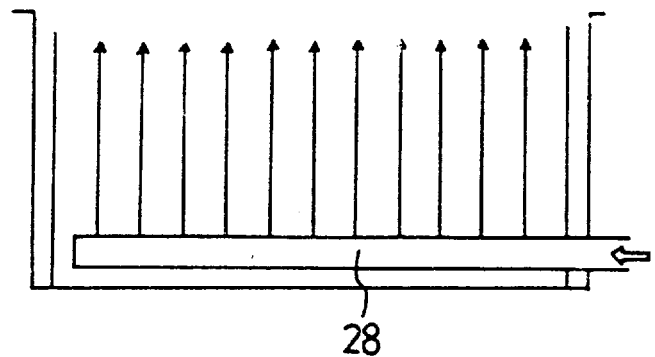
FIG. 2G shows the intensity of the cleaning solution spraying pressure from one side of a cleaning solution spraying nozzle in which the cleaning solution flows to the other sealed side thereof, through a hole on the surface of the cleaning solution spraying nozzle of the present invention.

As depicted in FIG. 2G, the present invention of FIGS. 2A to 2F which the sealed nozzle 28 itself and the hole on the nozzle are transformed, can uniformly eject the cleaning solution to the wafers with a uniform pressure regardless of the nozzle's location.

Figure 3:
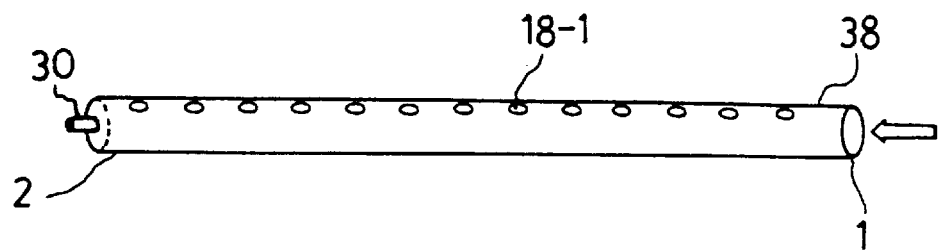
FIGS. 3 and 4 show another embodiments of a cleaning solution spraying nozzle of the present invention.

The fourth preferred embodiment of the present invention is illustrated in FIG. 3. The nozzle includes an open side 1, an opposite partially-open side 2 and a linking line 30 mounted on the partially-open side 2 for exhausting the specific amount of the cleaning solution to the exhaust pipe connected to the outerbath, the linking line is inserted into the innerbath.

Therefore, the backpressure occurring at one side through which the cleaning solution flows and the opposite side of the nozzle, is reduced as much as the open area in comparison with the conventional one, so that the cleaning solution spraying the intensity at the hole on the surface of the nozzle which is directly affected by the backpressure, decreases and that the cleaning solution is sprayed with a uniform pressure irrespective of the nozzle's location.

Figure 4:
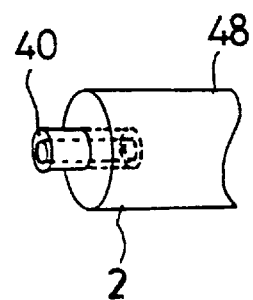

FIG. 4 shows the fifth embodiment of the present invention. The nozzle comprises an open side 1, an opposite partially-open side 2, and a flow control stopper 40 installed on the partially-open side 2 for controlling the amount of the exhausted cleaning solution by being inserted or extracted into or from the nozzle's surface, respectively, the flux control stopper being hollow with the fixed thickness.

As depicted in FIGS. 3 and 4, the backpressure affecting the partially-open side 2 of the cleaning solution spraying nozzles 38 and 48, is controlled by the flow of the specific amount of the cleaning solution to the partially-open side 2, so that the nozzles eject the cleaning solution to the wafers with a uniform pressure.

It will be apparent to those skilled in the art that various modifications and variations can be made in a cleaning apparatus of semiconductor device of the present invention without departing from the spirit or scope of the invention. Thus, it is intended that the present invention cover the modifications and variations of this invention provided they come within the scope of the appended claims and their equivalents.

What is claimed is:

1. A cleaning apparatus of a semiconductor device which comprises a bath where wafers are cleaned, and a cleaning solution spraying nozzle mounted at the bottom of the bath for spraying a cleaning solution through multiple holes of a specific size which are formed at the same interval on its surface, one side of the nozzle being connected to a cleaning solution supply tube and the other side of the nozzle being sealed, wherein the nozzle has a releasing hole at its sealed end side.

2. A cleaning apparatus as claimed in claim 1, wherein a size of the releasing hole is adjusted by using an adapter which is formed as a pipe which outer diameter is smaller than an inner diameter of the releasing hole.

* * * * *